US011057610B2

(12) United States Patent
Romano et al.

(10) Patent No.: US 11,057,610 B2
(45) Date of Patent: Jul. 6, 2021

(54) THREE DIMENSIONAL DEPTH MAPPING USING DYNAMIC STRUCTURED LIGHT

(71) Applicant: Facebook Technologies, LLC, Menlo Park, CA (US)

(72) Inventors: Nitay Romano, Sunnyvale, CA (US); Nadav Grossinger, Foster City, CA (US); Yair Alpern, Tivon (IL); Emil Alon, Pardes Hana (IL)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/859,871

(22) Filed: Apr. 27, 2020

(65) Prior Publication Data

US 2020/0267377 A1 Aug. 20, 2020

Related U.S. Application Data

(63) Continuation of application No. 16/032,304, filed on Jul. 11, 2018, now Pat. No. 10,687,047, which is a (Continued)

(51) Int. Cl.
*H04N 13/282* (2018.01)
*G06F 3/03* (2006.01)
(Continued)

(52) U.S. Cl.
CPC ......... *H04N 13/296* (2018.05); *G01S 7/4815* (2013.01); *G01S 17/46* (2013.01);
(Continued)

(58) Field of Classification Search
None
See application file for complete search history.

(56) References Cited

U.S. PATENT DOCUMENTS 5,335,288 A 8/1994 Faulkner
5,638,220 A 6/1997 Ohtomo et al.
(Continued)

FOREIGN PATENT DOCUMENTS

CN 1414420 A 4/2003
CN 101451826 A 6/2009
(Continued)

OTHER PUBLICATIONS

Australian Government, IP Australia, Examination report No. 1 for standard patent application, Australian Patent Application No. 2014338511, dated Jan. 17, 2018, four pages.
(Continued)

*Primary Examiner* — Christopher Braniff
(74) *Attorney, Agent, or Firm* — Fenwick & West LLP

(57) ABSTRACT

Apparatus for generating a dynamic structured light pattern for optical tracking in three-dimensional space, comprises an array of lasers, such as a VCSEL laser array, to project light in a pattern into a three-dimensional space; and an optical element or elements arranged in cells. The cells are aligned with subsets of the laser array, and each cell individually applies a modulation, in particular an intensity modulation, to light from the laser or lasers of the subset, to provide a distinguishable and separately controllable part of the dynamic structured light pattern. A method of generating a structured light pattern is disclosed, in which light is provided from an array of lasers, and light is individually projected from subsets of the array of lasers to provide differentiated parts of the structured light pattern.

20 Claims, 15 Drawing Sheets

Related U.S. Application Data continuation of application No. 15/030,851, filed as application No. PCT/IL2014/050922 on Oct. 23, 2014, now Pat. No. 10,091,494.

(60) Provisional application No. 61/894,471, filed on Oct. 23, 2013.

(51) Int. Cl.

| | | |
|---|---|---|
| H04N 13/128 | (2018.01) | |
| H04N 13/296 | (2018.01) | |
| H04N 13/207 | (2018.01) | |
| G01S 17/46 | (2006.01) | |
| G01S 7/481 | (2006.01) | |
| G02B 27/42 | (2006.01) | |
| G01S 17/89 | (2020.01) | |
| G06F 3/01 | (2006.01) | |
| H01S 5/42 | (2006.01) | |

(52) U.S. Cl.
CPC .......... *G01S 17/89* (2013.01); *G02B 27/4205* (2013.01); *G02B 27/4255* (2013.01); *G06F 3/017* (2013.01); *G06F 3/0304* (2013.01); *G06F 3/0321* (2013.01); *H04N 13/128* (2018.05); *H04N 13/207* (2018.05); *H04N 13/282* (2018.05); *H01S 5/423* (2013.01)

(56) References Cited

U.S. PATENT DOCUMENTS

| | | | |
|---|---|---|---|
| 6,040,910 | A | 3/2000 | Wu et al. |
| 6,102,552 | A | 8/2000 | Tullis |
| 6,549,288 | B1 | 4/2003 | Migd et al. |
| 6,714,234 | B1 | 3/2004 | Hillis |
| 7,140,543 | B2 | 11/2006 | Giordano et al. |
| 7,176,440 | B2 | 2/2007 | Cofer et al. |
| 7,440,590 | B1 | 10/2008 | Hassebrook et al. |
| 8,766,952 | B2 | 7/2014 | Lee et al. |
| 9,870,068 | B2 | 1/2018 | Romano et al. |
| 2002/0125435 | A1 | 9/2002 | Cofer et al. |
| 2002/0181742 | A1 | 12/2002 | Wlace et al. |
| 2003/0218761 | A1 | 11/2003 | Tomasi et al. |
| 2004/0004723 | A1 | 1/2004 | Seka et al. |
| 2004/0108990 | A1 | 6/2004 | Lieberman et al. |
| 2004/0119833 | A1 | 6/2004 | Duncan et al. |
| 2005/0057741 | A1 | 3/2005 | Anderson et al. |
| 2006/0176468 | A1 | 8/2006 | Anderson et al. |
| 2007/0120834 | A1 | 5/2007 | Boillot |
| 2008/0062123 | A1 | 3/2008 | Bell |
| 2008/0088588 | A1 | 4/2008 | Kitaura |
| 2008/0106746 | A1 | 5/2008 | Shpunt et al. |
| 2008/0138013 | A1* | 6/2008 | Parriaux ............... G02B 5/1814 385/37 |
| 2008/0256494 | A1 | 10/2008 | Greenfield |
| 2008/0317332 | A1 | 12/2008 | Ivanov et al. |
| 2009/0002342 | A1 | 1/2009 | Terada et al. |
| 2009/0016572 | A1 | 1/2009 | Hassebrook et al. |
| 2009/0027337 | A1 | 1/2009 | Hildreth |
| 2009/0167682 | A1 | 7/2009 | Yamashita et al. |
| 2009/0189858 | A1 | 7/2009 | Lev et al. |
| 2009/0195659 | A1 | 8/2009 | Nagata et al. |
| 2009/0322673 | A1 | 12/2009 | Cherradi El Fadili |
| 2010/0008588 | A1 | 1/2010 | Feldkhun et al. |
| 2010/0189372 | A1 | 7/2010 | Chen et al. |
| 2011/0007037 | A1 | 1/2011 | Ogawa |
| 2011/0019056 | A1 | 1/2011 | Hirsch et al. |
| 2011/0158508 | A1 | 6/2011 | Shpunt et al. |
| 2011/0234492 | A1* | 9/2011 | Ajmera ................... G06F 3/017 345/158 |
| 2011/0254810 | A1 | 10/2011 | Lee et al. |
| 2012/0051588 | A1 | 3/2012 | McEldowney |
| 2012/0162140 | A1 | 6/2012 | Lee et al. |
| 2012/0194561 | A1 | 8/2012 | Grossinger et al. |
| 2012/0200829 | A1 | 8/2012 | Bronstein et al. |
| 2013/0044054 | A1 | 2/2013 | Lee et al. |
| 2014/0334671 | A1 | 11/2014 | Lee et al. |
| 2015/0042680 | A1 | 2/2015 | Grossinger |
| 2015/0260830 | A1* | 9/2015 | Ghosh ..................... G01S 7/484 250/208.1 |
| 2015/0310670 | A1 | 10/2015 | Grossinger |
| 2015/0317037 | A1 | 11/2015 | Suzuki |

FOREIGN PATENT DOCUMENTS

| | | | |
|---|---|---|---|
| DE | 4115445 | A1 | 1/1992 |
| EP | 0547599 | B1 | 11/1997 |
| EP | 2166305 | A1 | 3/2010 |
| JP | 2000-267800 | | 9/2000 |
| JP | 2006-292385 | A | 10/2006 |
| JP | 2008216039 | | 9/2008 |
| JP | 2009192620 | | 8/2009 |
| JP | 2010091491 | | 4/2010 |
| JP | 2013-061228 | A | 4/2013 |
| KR | 10-2009-0084767 | A | 8/2009 |
| WO | WO 2009/018161 | A1 | 2/2009 |
| WO | WO 2009/153446 | A2 | 12/2009 |
| WO | WO2009153446 | * | 12/2009 |
| WO | WO 2011/036618 | A2 | 3/2011 |
| WO | WO 2012/026550 | | 3/2012 |
| WO | WO 2013/127974 | A1 | 9/2013 |
| WO | WO 2014/083485 | A1 | 6/2014 |

OTHER PUBLICATIONS

Boruah, B. R. "Dynamic Manipulation of a Laser Beam Using Liquid Crystal Spatial Light Modulator." Am. J. Phys., vol. 77, Iss. 4, Apr. 2009, pp. 331-336.
Canadian Intellectual Property Office, Office Action, Canadian Patent Application No. 2,924,622, dated Feb. 6, 2017, three pages.
Canadian Intellectual Property Office, Office Action, Canadian Patent Application No. 2,924,622, dated Mar. 2, 2018, three pages.
European Patent Office, Search Report and Opinion, European Patent Application No. 10818488.8, dated Jun. 30, 2015, eight pages.
Japan Patent Office, Japanese Patent Application No. 2019-081994, dated Mar. 24, 2020, 8 pages.
Japan Patent Office, Office Action, Japanese Patent Application No. 2016-519386, dated Aug. 1, 2018, thirteen pages.
Japan Patent Office, Office Action, Japanese Patent Application No. 2012-530394, dated Jan. 15, 2016, six pages.
Japan Patent Office, Office Action, Japanese Patent Application No. 2012-530394, dated Mar. 7, 2014, four pages.
Kim, H. et al., "Diffractive Optical Element with Apodized Aperture for Shaping Vortex-Free Diffraction Image," Japanese Journal of Applied Physics, Dec. 2004, pp. 1530-1533, vol. 43, No. 12A.
Konincka, T.P. et al., "Scene-Adapted Structured Light," 2005 IEEE Computer Society Conference on Computer Vision and Pattern Recognition, Jun. 20, 2005, pp. 611-618, vol. 2.
Korean Intellectual Property Office, Office Action, Korean Patent Application No. 10-2012-7009974, May 12, 2016, four pages.
Payeur, P. et al., Structured Light Stereoscopic Imaging with Dynamic Pseudo-Random Patterns, Jul. 6-8, 2009, Image Analysis and Recognition, 6th International Conference, ICIAR, Halifax, Canada, pp. 687-696.
PCT International Search Report and the Written Opinion, PCT Application No. Application No. PCT/IB2010/054228, dated Jun. 16, 2011, seven pages.
PCT International Search Report and Written Opinion, PCT Application No. PCT/IL2012/050523, dated May 27, 2013, fifteen pages.
PCT International Search Report and Written Opinion, PCT Application No. PCT/US2016/023611, dated Jun. 17, 2016, seventeen pages.
PCT International Search Report and Written Opinion, PCT Application No. PCT/IL2014/050922, dated Feb. 17, 2015, 12 pages.
Posdamer, J. L., "Surface Geometry Acquisition Using a Binary-Coded Structured Illumination Technique," Computers in Industry, vol. 3, No. 1-2, Mar. 1, 1982, pp. 83-92.

(56) References Cited

OTHER PUBLICATIONS

State Intellectual Property Office of the People's Republic of China, First Office Action, Chinese Patent Application No. 201480058469.9, dated Mar. 8, 2017, twenty pages.
State Intellectual Property Office of the People's Republic of China, Second Office Action, Chinese Patent Application No. 201480058469.9, dated Oct. 25, 2017, seventeen pages.
State Intellectual Property Office of the People's Republic of China, Third Office Action, Chinese Patent Application No. 201480058469.9, dated Feb. 7, 2018, twelve pages.
Twardowski, P. et al., Three Dimensional Shape Measurement Based on Light Patterns Projection Using Diffractive Optical Elements; Proceedings of SPIE, vol. 7716, Apr. 30, 2010, pp. 771621-771621-8.
United States Office Action, U.S. Appl. No. 15/030,851, dated Nov. 1, 2017, 16 pages.
United States Office Action, U.S. Appl. No. 15/057,382, dated Jun. 17, 2016, 17 pages.
Weinmann, Michael et al., A Multi-Camera, Multi-Projector Super-Resolution Framework for Structured Light, 2011 International Conference on 3D Imaging, Modeling, Processing, Visualization and Transmission, IEEE, May 16, 2011, pp. 397-404.

\* cited by examiner

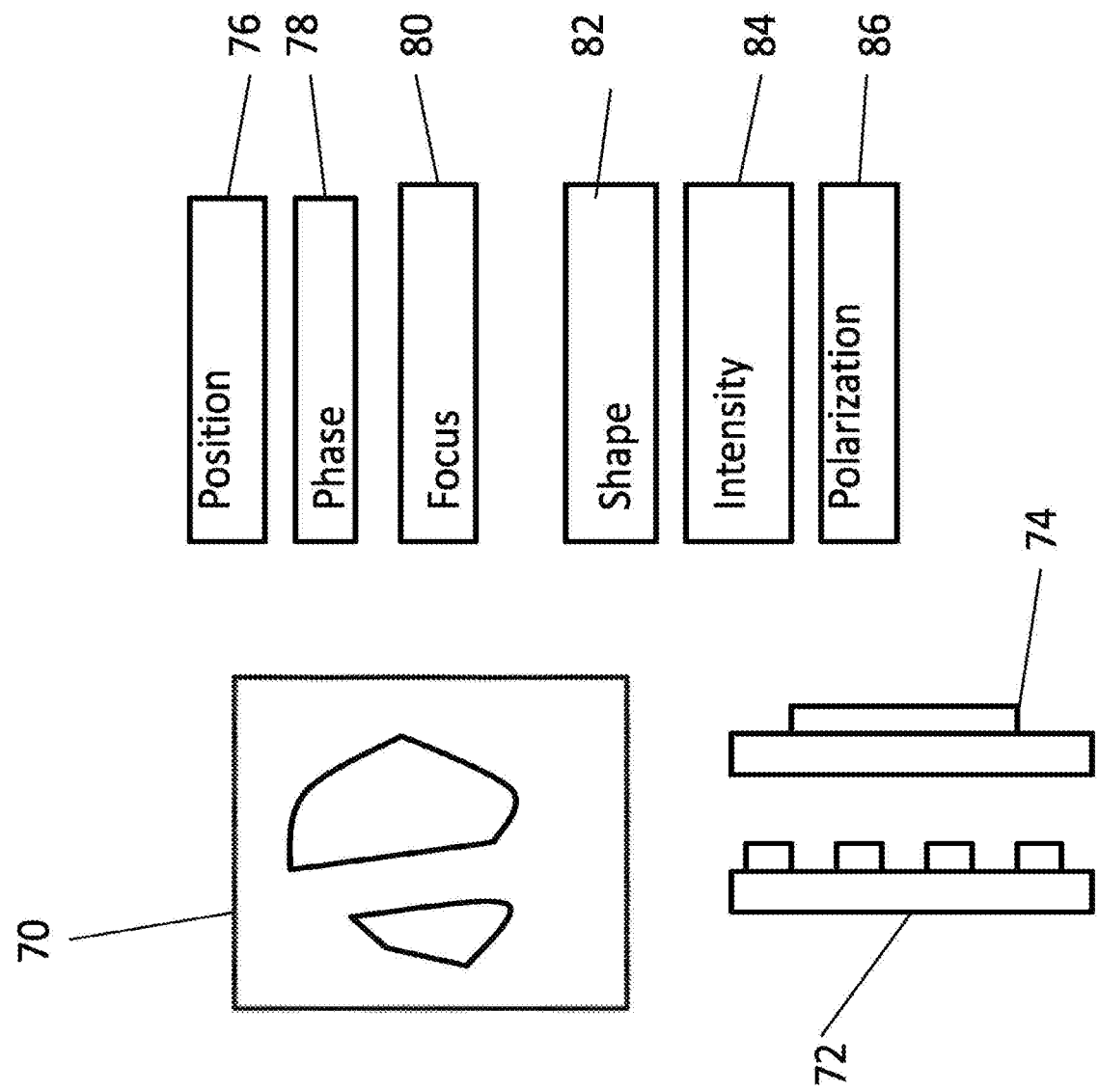

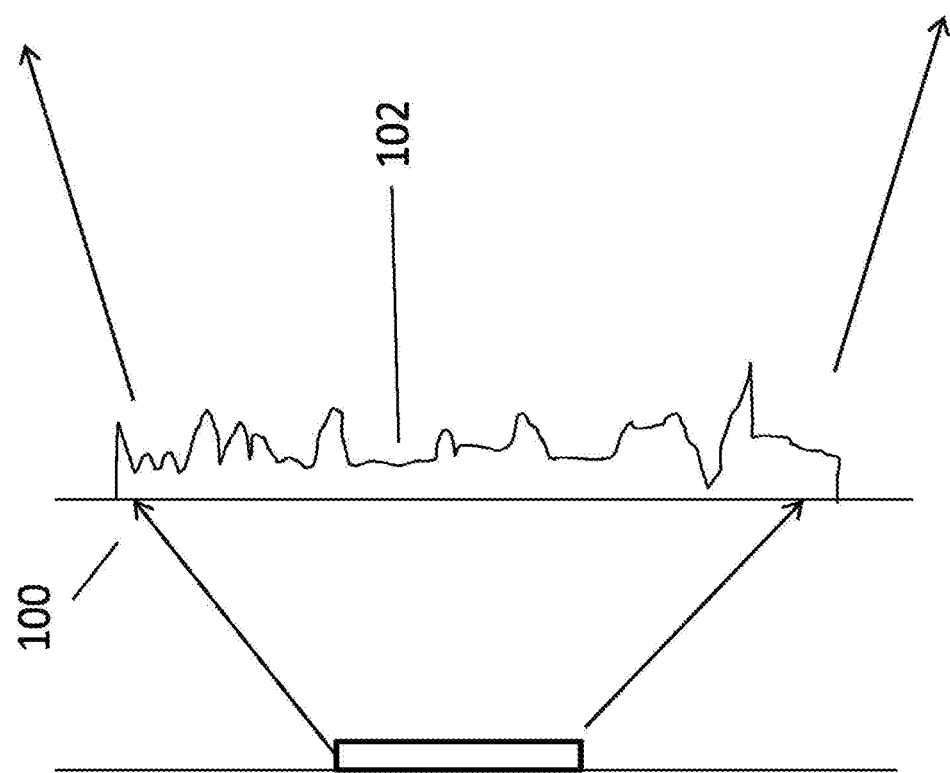

FIG. 13
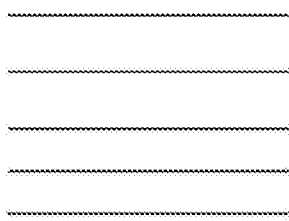
Fig. 14
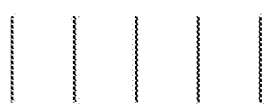
Fig. 15
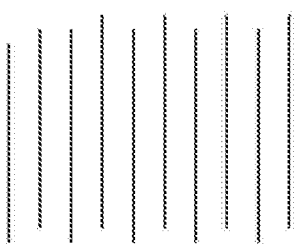
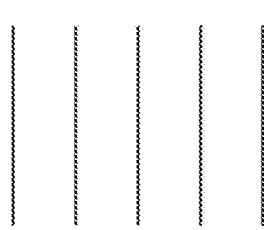
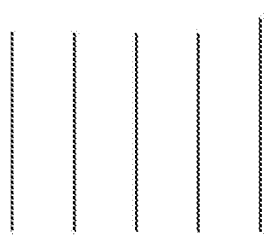
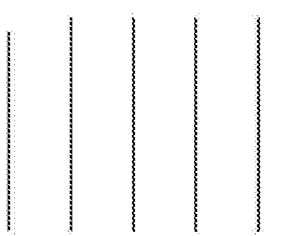

THREE DIMENSIONAL DEPTH MAPPING USING DYNAMIC STRUCTURED LIGHT

CROSS REFERENCE TO RELATED APPLICATIONS

This application is a continuation of co-pending U.S. application Ser. No. 16/032,304, filed Jul. 11, 2018, which is a continuation of U.S. application Ser. No. 15/030,851, filed Apr. 20, 2016, now U.S. Pat. No. 10,091,494, issued Oct. 2, 2018, which is a National Phase Application of International Application No. PCT/IL2014/050922, filed Oct. 23, 2014, which claims the benefit of U.S. Application No. 61/894,471, filed Oct. 23, 2013, all of which are herein incorporated by reference in their entirety.

BACKGROUND

The present invention relates to three-dimensional depth mapping using structured light, and more particularly, but not exclusively, to a system for tracking in order to provide input to a computer or like device.

Tracking in order to provide input to a computer, or other computational device, involves such ubiquitous technologies as the computer mouse. Tracking of styluses and fingers in a three-dimensional field in front of the computer is also available and uses various tracking technologies such as visual and IR imaging and ultrasonic. The term 'tracking' may refer to following the positioning and motion of an object, and includes processing of inputs received at the tracking computer in order to determine the position or motion. Thus in the case of a computer mouse, tracking may include processing the mouse outputs to determine motion. In the case of an object being followed visually, the term tracking may include image processing of successive frames capturing the object.

One method of imaging simply uses cameras to view and process a scene. The cameras may follow specific marks that are placed in the scene or the imaging system can look for specifically recognizable features such as fingers.

Drawbacks of such visual imaging include a requirement that the three-dimensional area is sufficiently lit up. Furthermore the only features that can be tracked are features that are recognized in advance, and motion tracking combined with feature recognition may not give accurate results.

In order to overcome the above problems, tracking using structured light was introduced. A known pattern of pixels is projected onto the space where tracking is to occur. The way that the pattern deforms on striking surfaces allows the vision system to calculate the depth and surface information of objects in the scene. Typical patterns used are grids or horizontal bars. Various devices use structured light patterns to enable the use of gesture recognition and 3D depth mapping. The structured light patter transmitter includes a laser emitter and a diffractive optical element (DOE).

Projecting a narrow band of light onto a three-dimensionally shaped surface produces a line of illumination that appears distorted from other perspectives than that of the projector, and can be used for an exact geometric reconstruction of the surface shape. A faster and more versatile method is the projection of patterns consisting of many stripes at once, or of arbitrary fringes, as this allows for the acquisition of a multitude of samples simultaneously. Seen from different viewpoints, the pattern appears geometrically distorted due to the surface shape of the object.

Although many other variants of structured light projection are possible, patterns of parallel stripes are widely used. The displacement of the stripes allows for an exact retrieval of the 3D coordinates of any details on the object's surface.

One known method of stripe pattern generation is the laser interference method, which utilizes two wide planar laser beam fronts. Interference between the beam fronts results in regular, equidistant line patterns. Different pattern sizes can be obtained by changing the angle between these beams. The method allows for the exact and easy generation of very fine patterns with unlimited depth of field. Disadvantages are high cost of implementation, difficulties providing the ideal beam geometry, and laser typical effects such as speckle noise and the possible self-interference with beam parts reflected from objects. Furthermore, there is no means of modulating individual stripes, such as with Gray codes.

Specifically, a disadvantage of using a single source emitter such as an edge emitter laser diode is the fact that the light pattern that it produces can be controlled only as a single unit. This means that the light pattern can be entirely turned on, off or dimmed but cannot be changed dynamically.

Structured light patterns may be constructed using invisible light such as IR light.

Alternatively high frame rates may render the structured light imperceptible to users or avoid interfering with other visual tasks of the computer.

The vertical-cavity surface-emitting laser, or VCSEL is a type of semiconductor laser diode in which laser beam emission is perpendicular from the top surface, as opposed to conventional edge-emitting semiconductor lasers which emit from surfaces formed by cleaving the individual chip out of a wafer.

There are several advantages to producing VCSELs, as opposed to edge-emitting lasers. Edge-emitters cannot be tested until the end of the production process. If the edge-emitter does not function properly, whether due to bad contacts or poor material growth quality, the production time and the processing materials have been wasted. VCSELs can be tested at several stages throughout the process to check for material quality and processing issues. For instance, if the vias have not been completely cleared of dielectric material during the etch, an interim testing process may be used to determine that the top metal layer is not making contact with the initial metal layer. Additionally, because VCSELs emit the beam perpendicularly to the active region of the laser, tens of thousands of VCSELs can be processed simultaneously on a three inch Gallium Arsenide wafer. Furthermore, even though the VCSEL production process is more labor and material intensive, the yield can be controlled to a more predictable outcome.

There is a significant advantage in that the use of VCSEL laser array for a structured light system, in that use of the array allows for a reduction in the size of the structured light transmitter device. The reduction is especially important for embedding the transmitter in devices with size restrictions such as a mobile phone or wearable devices.

However, despite the above advantages, the VCSEL array is not currently used for structured light scanning systems for a number of reasons. Many diffraction patterns require a coherent Gaussian shaped beam in order to create the high density patterns needed for high resolution tracking. The VCSEL array merely provides multiple individual Gaussian beams positioned next to each other and usually with overlap between them. The multiple points and overlap between them reduce the detection performance in high density areas in the light pattern and restrict the use of various diffractive design techniques that requires a pre-defined Gaussian beam. Such designs include a Top-Hat design, Homogeneous line generators, and other complex high performance structures.

Indeed the problem with a standard diffractive design is that the entire VCSEL laser array is used as a single light source. Thus, when using a multiple spot design the array image is obtained for each spot instead of having a focused Gaussian beam. A diffractive design that requires a Gaussian beam as an input will not get the required output at all. The problem becomes more severe in dense light patterns, because in these light patterns there is a need to focus the source beam onto a tiny spot in order to separate the features and this is not possible if the light source is an array of lasers.

SUMMARY

The present embodiments provide an array of VCSEL lasers, where the lasers of the array are modulated individually or in groups. The individual lasers or groups may be modulated statically or dynamically to provide and alter a structured light pattern as needed.

Thus each laser in the array, or group of lasers being moderated together, is provided with its own optical element, typically a diffraction element. The diffraction element can be individually controlled so that the overall structured light pattern can be selected for given circumstances and/or can dynamically follow regions of interest.

According to a first aspect of the present invention there is provided apparatus for generating a structured light pattern, comprising:

an array of lasers arranged to project light in a pattern into a three-dimensional space; and a plurality of optical elements, respective optical elements defining cells, the cells being aligned with respective subsets of the array of lasers, the optical element of each cell individually applying a modulation to light passing through the optical element from the respective subset to provide a distinguishable part of the structured light pattern.

In an embodiment, the optical modulation is any of a diffractive modulation, a refractive modulation, and a combination of a diffractive and a refractive modulation.

In an embodiment, the optical elements and the subset of the array of lasers comprising a respective cell are constructed from a single molded element.

In an embodiment, a width of the cell is 1 mm or less.

In an embodiment, a width of the optical element is 1 mm or less.

In an embodiment, the cells are individually controllable to change the diffractive modulation.

In an embodiment, the cells are controllable dynamically to provide changes to the structured light pattern based on receiving and analyzing at least one captured frame, the frame comprising a plurality of pixels in a two-dimensional layout.

In an embodiment, the cells are further controllable in respect of positioning within the structured light pattern and in respect of a shape applied to the light.

In an embodiment, the dynamic control is configurable to apply increased resolution of the structured light pattern to parts of the scene to apply reduced resolution of the structured light pattern to other parts of the scene.

In an embodiment, the dynamic changes to the structured light pattern comprise changes to orientation of the structured light pattern.

In an embodiment, the dynamic changes to the structured light pattern comprise cell wise change.

In an embodiment, the change is any of a change in intensity, a change in polarization, a change in filtering parameters, and a change in focus.

In an embodiment, the subsets are any of individual lasers, pairs of lasers, triplets of lasers, combinations of different sizes of lasers, and dynamically changing combinations of lasers.

In an embodiment, light projected from respective subsets is tiled or overlapped.

In an embodiment, the laser array comprises a VCSEL laser array.

In an embodiment, the laser array comprises a laser bar.

The apparatus may be incorporated into any of: a computer, a laptop computer, a mobile communication device, a tablet device, a game console, and a movement capture device.

The apparatus may be used for tracking of a three-dimensional scene.

According to a second aspect of the present invention there is provided a method of generating a structured light pattern for three-dimensional tracking, the method comprising: Providing light from an array of lasers; and individually projecting light from subsets of the array of lasers to provide differentiated parts of the structured light pattern.

According to a third aspect of the presenting invention there is provided apparatus for generating a structured light pattern, comprising: an array of lasers arranged to project light in a pattern into a three-dimensional space; and a plurality of optical element cells, the cells being aligned with respective subsets of the array of lasers, each cell individually applying an intensity modulation to light passing through the element from the respective subset to provide a distinguishable part of the structured light pattern.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods, and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions.

Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 7 is a schematic diagram illustrating different modulations that can be applied by the optical element according to embodiments of the present invention;

FIG. 10 is a simplified diagram showing an optical element carrying out beam shaping in accordance with embodiment of the present invention;

FIG. 13 illustrates dynamic changing of patterns according to embodiments of the present invention, in this case between vertical and horizontal lines;

FIG. 14 illustrates dynamic changing of patterns from a large to a small field of view, according to embodiments of the present invention;

FIG. 15 illustrates dynamic changing of patterns between low density and high density lines according to embodiments of the present invention;

DETAILED DESCRIPTION

Figure 1:
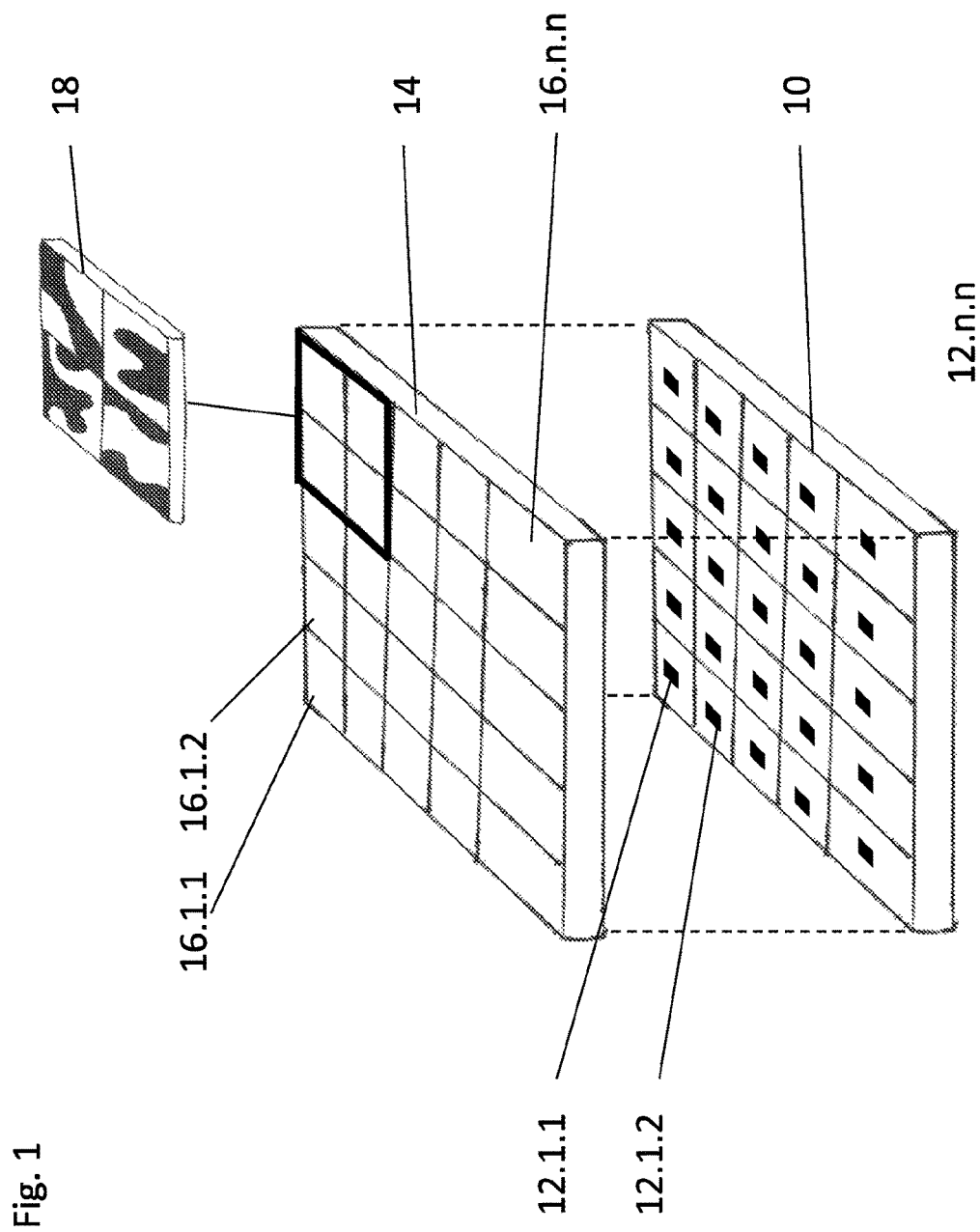
FIG. 1 is a simplified schematic diagram illustrating a basic setup of a structured light generating apparatus according to an embodiment of the present invention, wherein a cell of the optical element, having an individual pattern, corresponds to a specific VCSEL in the VCSEL laser array.

The present invention, in some embodiments thereof, relates to three-dimensional depth mapping using structured light, and more particularly, but not exclusively, to a system for tracking in order to provide input to a computer.

The following applications to the same assignee are hereby incorporated by reference as if fully set forth herein, namely U.S. patent application Ser. No. 13/497,589, filed Sep. 19, 2010, International Patent Application No. WO2013/088442 filed 13 Sep. 2012, U.S. Provisional Patent Application No. 61/926,476 filed 13 Jan. 2014, and U.S. Provisional Patent Application No. 62/035,442 filed 10 Aug. 2014.

As discussed above, various devices use structured light patterns to enable gesture recognition and 3D depth mapping. A structured light pattern transmitter includes a light source, for example a laser emitter, and an optical element such as a diffractive optical element (DOE). As many diffractive designs requires a coherent Gaussian shaped beam in order to create high density patterns, the use of a VCSEL laser array is generally not possible. The optical element, for example the VCSEL array, creates multiple Gaussian shaped beams with overlap, which reduces the detection performance in high density areas in the light pattern and restricts the use of various diffractive design techniques that require a pre-defined Gaussian beam. Such designs include a Top-Hat design, Homogeneous line generators, and other complex high performance structures.

There is, however, a significant advantage in the use of VCSEL laser array to reduce the size of the structured light transmitter device. This is especially important for embedding the transmitter in devices with size restrictions such as a mobile phone or wearable devices.

Thus, the present embodiments provide an array of VCSEL lasers, where the lasers of the array are modulated individually or in groups. The individual lasers or groups may be modulated statically or dynamically to provide and alter a structured light pattern as needed.

Each laser in the array, or group of lasers being moderated together, is provided with its own cell of an optical element, typically a diffraction element. The cells of the diffraction element can be individually controlled to provide different light patterns at different parts of the array so that the overall structured light pattern can be selected for given circumstances and/or can dynamically follow regions of interest, as will be discussed in greater detail below. Typical structures include stripes, grids, and dots.

As mentioned, a problem using a single source emitter such as an edge emitter laser diode is the fact that the light pattern that it produces can be controlled only as a single unit. Consequently, the light pattern can be entirely turned on, off or dimmed but cannot be changed dynamically. By contrast, each VCSEL laser in the array according to the present embodiments can be controlled individually, since control is at the level of the cell of the optical element, and suitable design of, for example, the DOEs may provide a dynamic light pattern that can produce flexible detection for various use cases and feedbacks. In the following the term 'cell' relates to a surface operable with a single laser or any group of lasers that are operated together to provide a particular part of the pattern. The cell structure may change dynamically as the pattern is changed.

Instead of a diffractive optical element, a refractive element may be used, or a combination of diffractive and refractive elements.

According to one embodiment the cell and/or the optical element of the cell may be limited by size, for example, the cells may be of the order of magnitude of less than 1 mm.

In more detail, the present embodiments relate to a generic lens/DOE design that enables the use of a VCSEL array to produce a dynamic light pattern. The DOE is positioned on the surface adjacent to the VCSEL array such that the plane of the DOE is parallel to the plane of the array/matrix. In the present embodiments, the surface of the DOE is divided into cells. Each cell represents an area which is positioned above a single VCSEL laser or a sub-group of VCSELs that are intended to be controlled together. For clarity, the lasers in the group or subgroup are controlled together, separately from lasers in other groups or subgroups.

A unique diffractive pattern may be designed for each cell, creating part of the required structured light pattern. The individual pattern generated by the VCSEL lasers following each cell's diffractive pattern creates a sub pattern of the structured light. The overall pattern is then formed from the patterns of the individual cells, for example by tiling, overlapping, or other ways for positioning of individual features.

The Design of each cell may comprise two optical functions. A first positioning function determines the position of the light feature in the entire structured light image.

For example, such a positioning function may consist of a prism blazed grating bending the position of the diffracted light to the actual position of the tile in the required pattern. A second, optical, function relates to the shape of the light feature. Examples of such optical functions may include a line generator, a multi spot pattern or other features or sub-features of the light pattern.

With suitable alignment between the VCSEL laser matrix and the cell based DOE any pattern can be achievable since the adjacent-Gaussians beam shape of the entire array is avoided as a single light source perspective.

In another embodiment, a dynamic light pattern is presented. Each cell can be controlled individually in terms of output intensity by applying different currents to the DOE at the appropriate location, and thus various features in the structured light pattern can be controlled as well.

Dynamic control, meaning changing the cell pattern during the course of tracking, enables various functions. That is to say, the optical element of each cell may be dynamically changed according to received data, for example in a sequence beginning with an initial configuration of the lasers. A frame is captured of the scene, the frame for example being a two-dimensional array of pixels. The received frame is analyzed. Then a new laser configuration is reached based on the analyzed frame. The new laser configuration then becomes the initial configuration for the next stage as the cycle continues. An example is illustrated and discussed below with respect to FIG. 19. For example it is possible to confirm the source of each viewed light feature by altering the intensity of a suspected VCSEL. Such confirmation is very useful in triangulation based depth detection methods. A further function is the ability to alter the density of the light pattern. Altering the density enables higher resolution sampling after the scenario has been roughly mapped, and may correct intensity errors caused by the camera setup or other scenario effects such as lighting conditions, reflectivity etc. Furthermore, it is possible to change the orientation of features in the light pattern.

Altering either the intensity or the orientation provide ways of giving the image processing software an additional chance to process the scene from what is effectively a new perspective, and according to data received from the camera, as discussed above.

Reference is now made to FIG. 1, which is a simplified schematic diagram that describes a basic arrangement of a device for three dimensional tracking using patterned light according to the present embodiments. It is to be appreciated that in this and the following figures, dotted and dashed lines represent conceptual and structural lines as provided by the context, and not necessarily physical lines visible in the respective embodiment.

In the arrangement of FIG. 1, a light producing array, for example a laser array, which may be VCSEL array 10, comprises a matrix of lasers 12.1.1 . . . 12.$n.n$. An optical element 14 comprises cells 16.1.1 . . . 16.$n.n$, which are aligned externally to the lasers, so that individual cells are located to modulate the light from a respective laser. Each laser has a separate cell of for example the diffractive optical element and each separate cell has a different diffractive pattern. Zoom 18 of the cells 16 shows four diffractive elements each with a unique diffractive pattern. Thus the diffractive optical element has multiple individual designs, one per cell, where each design diffracts the light of one VCSEL laser.

The setup may generate a structured light pattern from the array of lasers which is projected into a three-dimensional space for tracking objects and parts of scenes within that space. The structured light pattern may be any suitable pattern that can be parsed to provide depth information to the computer, and includes patterns including regions of stripes, grids, and/or dots.

The cells are aligned with subsets of the array of lasers, and each cell individually applies a diffractive modulation to light passing through, so that each subset provides a distinguishable part of the structured light pattern.

The cells 16.1.1 . . . 16.$n.n$ may be individually controllable to change the diffractive modulation. Thus different parts of the pattern may be different, and different structured light patterns can be used in different circumstances, or in different parts of the scene.

The cells may further be controlled dynamically to provide changes to the structured light pattern. Thus, the pattern may change to increase resolution in parts of the scene deemed to be of interest and/or may reduce resolution in parts of said scene deemed not to be of interest. Alternatively, particular parts of the pattern may be momentarily changed to indicate a particular light source reaching a particular part of the scene, so as to give additional clues for triangulation and depth estimation. Typically the intensity would be changed. That is to say the change is based on controlling the intensity of the array of lasers affecting the cell. As alternatives, the polarization, filtering parameters, or focal length may be changed or any other feature of the light apparent to those skilled in the art.

The intensity may be changed over part or all of the pattern. For example, parts of the scene may be brightly lit by incident light and other parts of the scene may be dimly lit. High intensity light may be aimed at the brightly lit parts and low intensity light to the dimly lit parts, thus saving power.

Alternatively, the density of the pattern may be changed or the orientation of the pattern may be changed, typically to give a different view of the scene for the tracking and depth estimation, as will be discussed in greater detail below. Regarding orientation, a feature of the scene may be more effective illuminated in a given orientation. For example a long narrow feature may be most effectively illuminated by stripes perpendicular to its longitudinal direction. The stripe direction may be updated as the orientation of the feature changes over time. Density too may be altered over time to allow particular features to be tracked more accurately, or as fine features come into view.

The subsets shown in FIG. 1 are individual lasers. However, as will be discussed in connection with the following figures, alternative subsets include pairs of lasers, triplets of lasers, combinations of different sizes of laser groupings, and dynamically changing combinations of lasers. The cells may be of the order of magnitude of 1 mm.

The projected light may be organized as tiles or overlappings or any other suitable arrangement.

The structured pattern based tracking arrangement may be incorporated into a computer, including a laptop computer, or a tablet or pod device or a mobile communication device such as a mobile telephone, or a game console, or a movement capture device, such as the kind of device used by animators to capture movements by actors, or any kind of device where tracking in three dimensions may provide a useful input.

Instead of a single diffractive optical element arranged in cells, multiple diffractive elements may be used, and all reference to cells herein are to be construed as additionally referring to separate optical elements.

The present embodiments thus allow generating of a structured light pattern using a VCSEL laser array and a diffractive optical element (DOE) and controlling each VCSEL individually for altering the structured light pattern dynamically.

Dynamic control may include altering the intensity of individual features in the light pattern, or the density or orientation of the features, or indeed turning on and off individual features of the light pattern, or changing the any of the above based on feedback from the structured light analysis. For example if the analysis reveals that greater resolution is needed, then the density may be increased, as will be discussed in greater detail below. If the analysis reveals that external lighting is interfering with the readout, then intensity is increased. If light reflections from external lighting is a problem then the orientation of the light pattern may be changed. As mentioned above, aside from issues of external lighting, it is possible to reorient the stripes so as to keep them perpendicular to the object being tracked. Thus feedback from the scenario is used to alter the lighting pattern. Incident lighting conditions in the scene can be dealt with by adjusting brightness over affected parts of the pattern. Thus, control of individual cells can allow certain areas of the pattern to be modified based on feedback from the scene and not others. The pattern may be dynamically changed between grids, stripes and dots or any other pattern that may be used, and different cells may have different patterns, the cells being dynamically redefined as needed.

Figure 2:
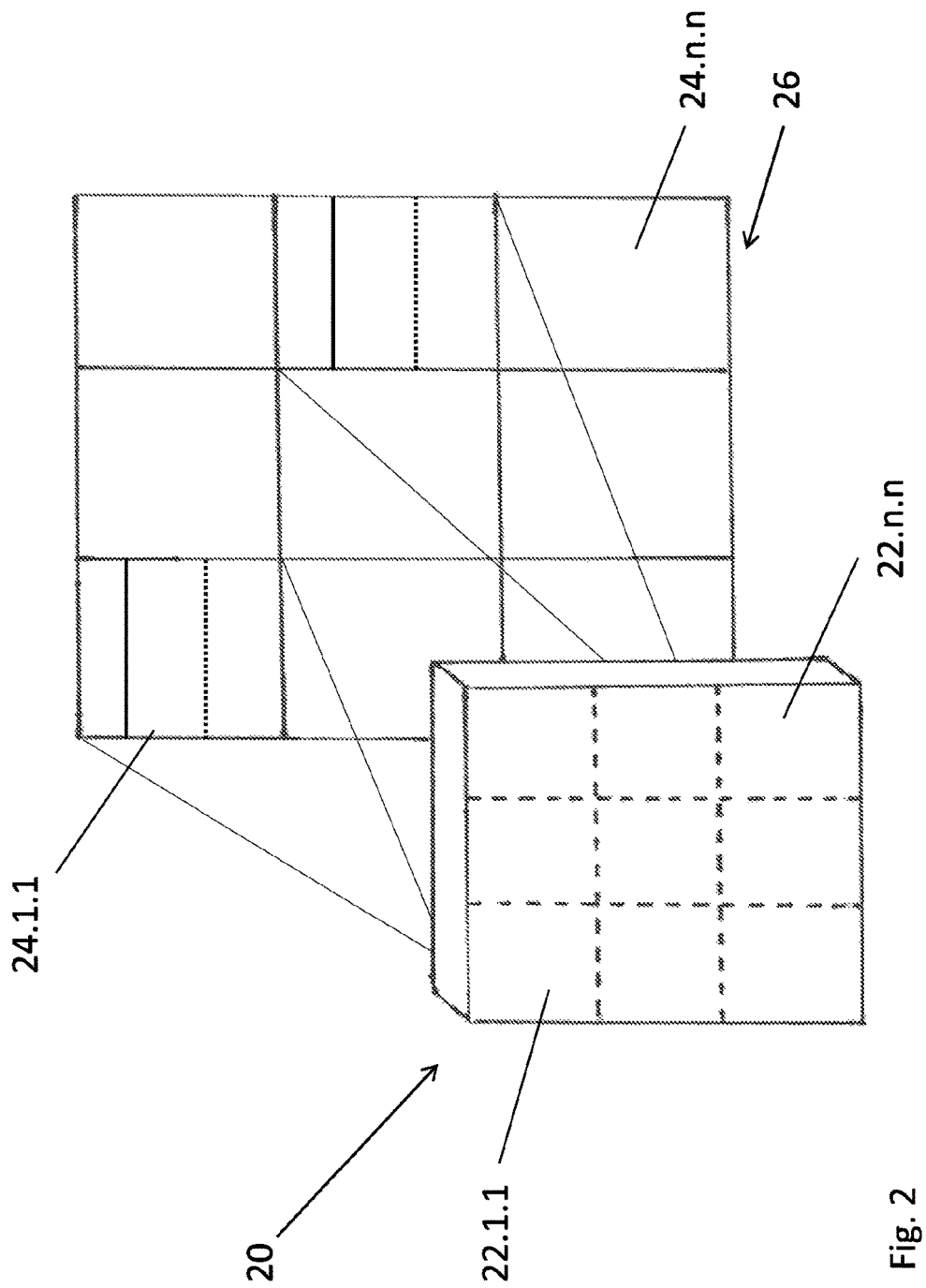
FIG. 2 is a simplified schematic diagram of the embodiment of FIG. 1 and showing a light pattern construction wherein each cell creates a partial tile of an overall structured light pattern.

Reference is now made to FIG. 2, which is a simplified schematic diagram showing one way in which the arrangement of FIG. 1 may be used. In FIG. 2, the array of lasers is indicated by numeral 20 and each laser 22.1.1 . . . 22.$n.n$ corresponds to a single cell. The cell illuminates a different tile 24.1.1 . . . 24.$n.n$ respectively in a forward projection 26. In projection 26, each tile has a different pattern, and all the tiles merge together to form a complete light pattern.

Figure 3:
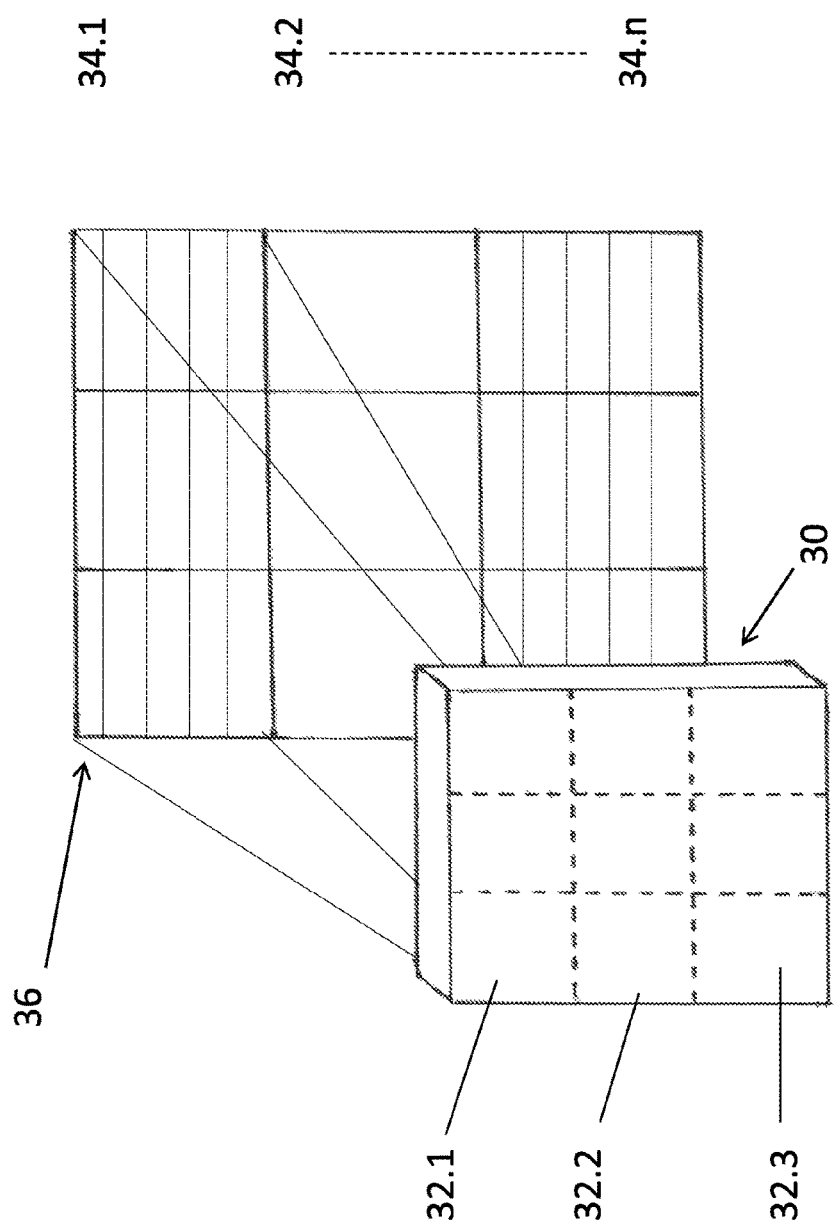
FIG. 3 is a schematic diagram illustrating a variation of the embodiment of FIG. 1, wherein each cell consists of a triplet of VCSEL lasers.

Reference is now made to FIG. 3, which is a simplified schematic diagram illustrating a variation of the arrangement of FIG. 1 in which a cell caters for two or more VCSEL lasers, specifically three in the case illustrated. In FIG. 3, the array of lasers is indicated by numeral 30 and individual lasers are combined by the optical element into a three-laser cell 32.1-32.3. The cells illuminate different tile triplets 34.1 . . . 34.$n$ respectively in a forward projection 36. In projection 36, all tiles in the same triplet share a pattern but each triplet has a different pattern within the overall projected light pattern 36.

Figure 4:
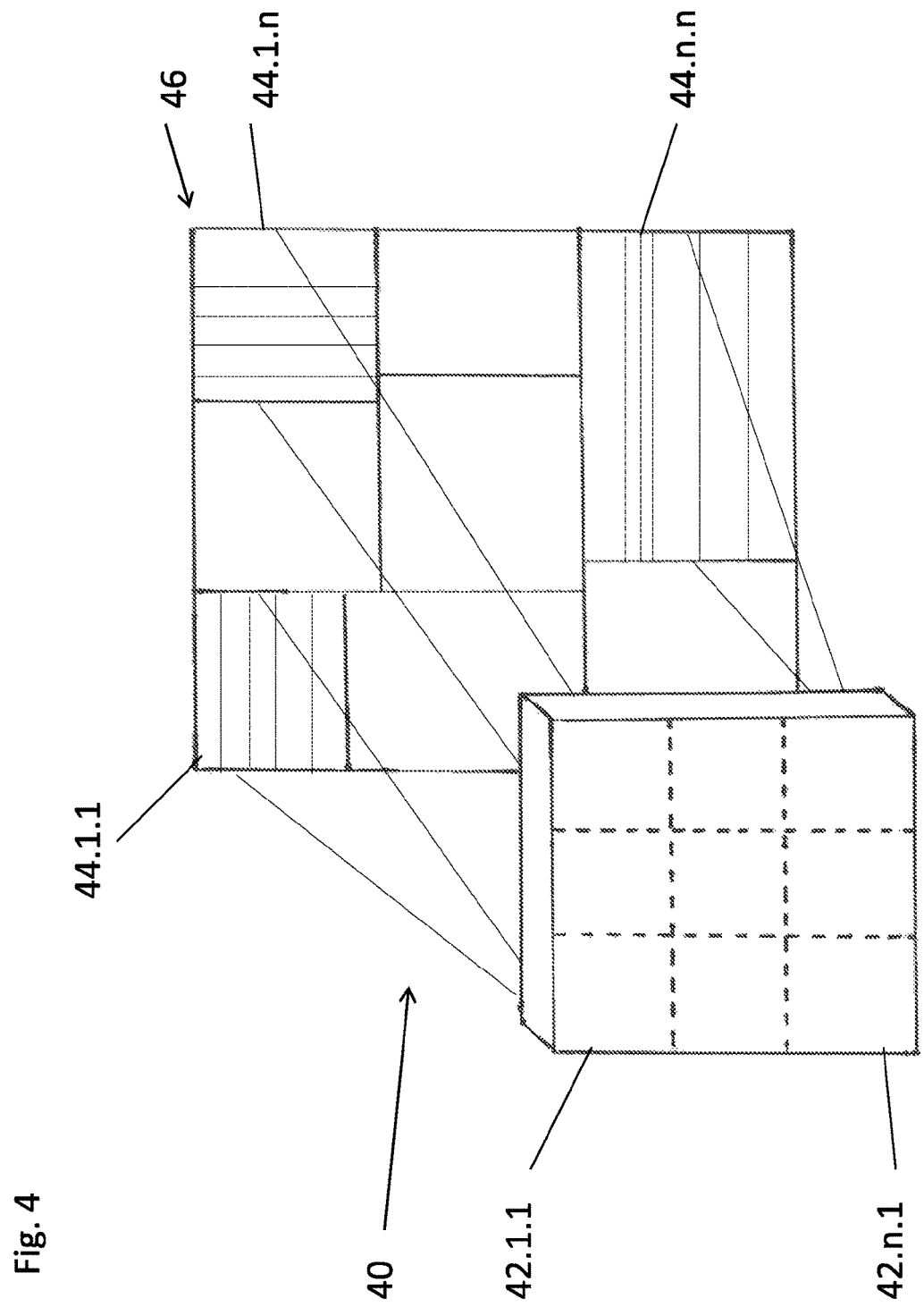
FIG. 4 is a schematic diagram illustrating a variation of the embodiment of FIG. 1 in which different light patterns are created by different cell patterns as before but the cells are of various sizes and orientations.

Reference is now FIG. 4 which is a simplified schematic diagram illustrating a variation of the arrangement of FIG. 1 in which different cells have different designs and different orientations. In FIG. 4, the array of lasers is indicated by numeral 40 and individual lasers 42.1.1 . . . 42.$n.n$ form one and two laser cells. The cells illuminate different tiles 44.1.1 . . . 44.$n.n$ respectively in a forward projection 46. In projection 46, the tiles are of variable sizes, and there is one cell size of two sharing a single pattern.

Figure 5:
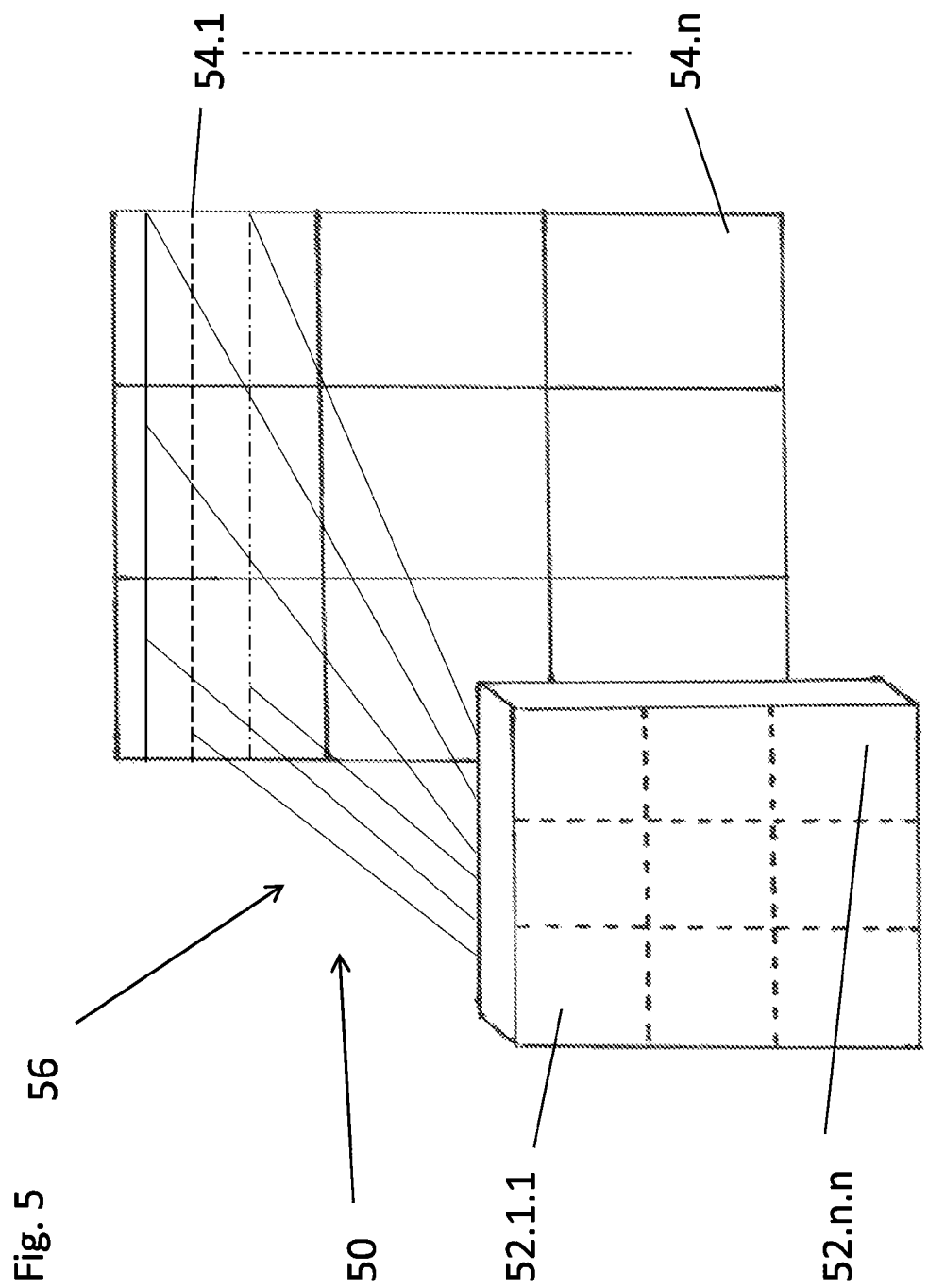
FIG. 5 is a schematic diagram illustrating a variation of the embodiment of FIG. 1 in which different light patterns are created by different cell patterns as before and individual cells are responsible for various light features of the overall structured pattern that are not necessarily organized in separated tile structures.

Reference is now made to FIG. 5, which is a simplified schematic diagram illustrating a further variation of the arrangement of FIG. 1 in which each cell is responsible for producing various light features of the pattern that are not necessarily organized in separate tile structures. In FIG. 5, the array of lasers is indicated by numeral 50 and individual lasers 52.1.1 . . . 52.$n.n$ form individual one-laser cells. The laser 52.1.1 illuminates tile triplet 54.1 in a forward projection 56 to provide horizontal lines over the triplet of tiles.

Figure 6:
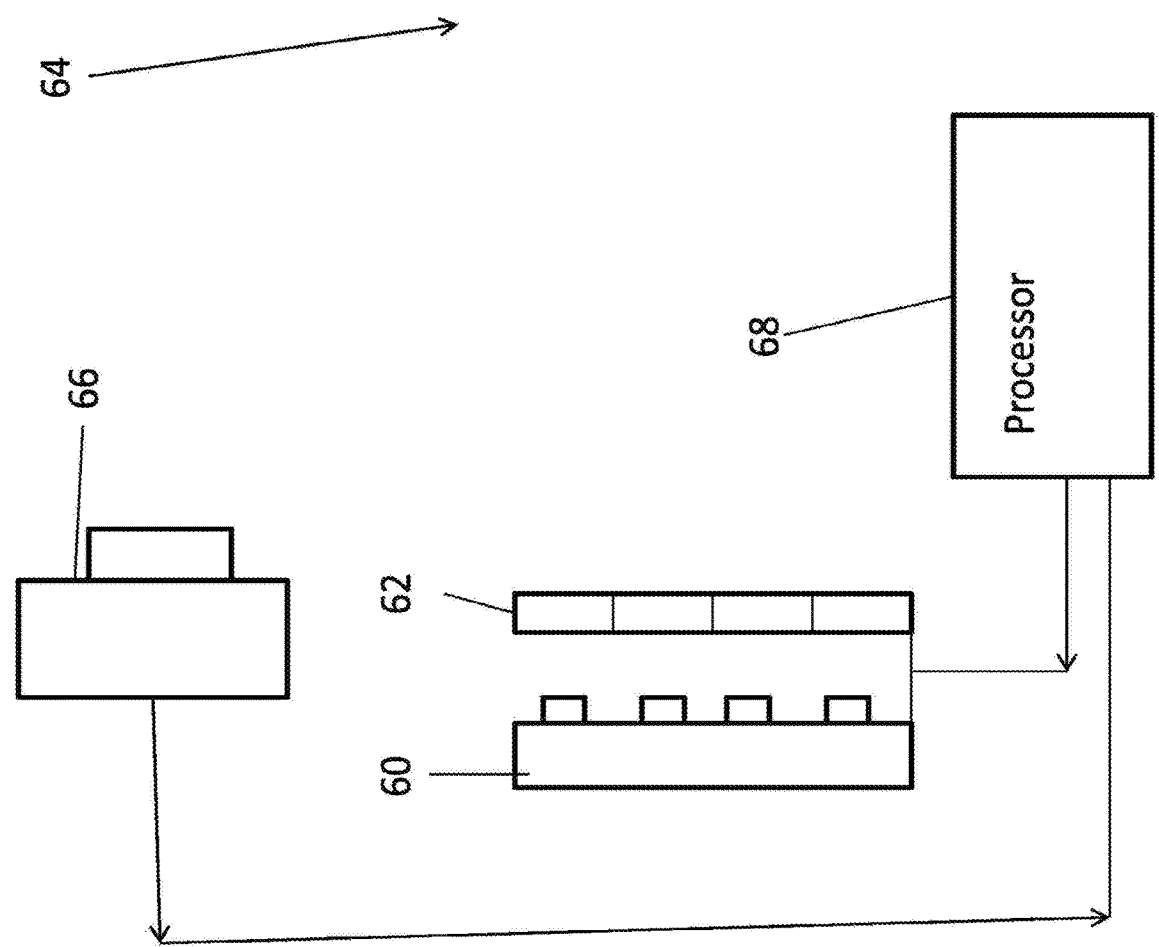
FIG. 6 is a schematic diagram illustrating a tracking system with a camera and a processor according to embodiments of the present invention.

Reference is now made to FIG. 6 which is a simplified schematic diagram which illustrates an exemplary system for tracking according to embodiments of the present invention. VCSEL array 60 produces laser light which is modulated by optical element 62 to form a pattern shone into a 3D volume 64. Camera 66 monitors the 3D volume and produces image frames which are analyzed by processor 68. The processor 68 both carries out tracking and also modifies the light modulations in order to improve tracking, as will be discussed in greater detail below. The processor may be an external processor such as that of a mobile device. The camera may a digital camera or any imagery sensor which may be based, for example on a complementary metal oxide silicon (CMOS) array. The processor may be connected to both the camera and the lasers, so that once the frame is analyzed the processor controls the lasers accordingly.

Figure 11:
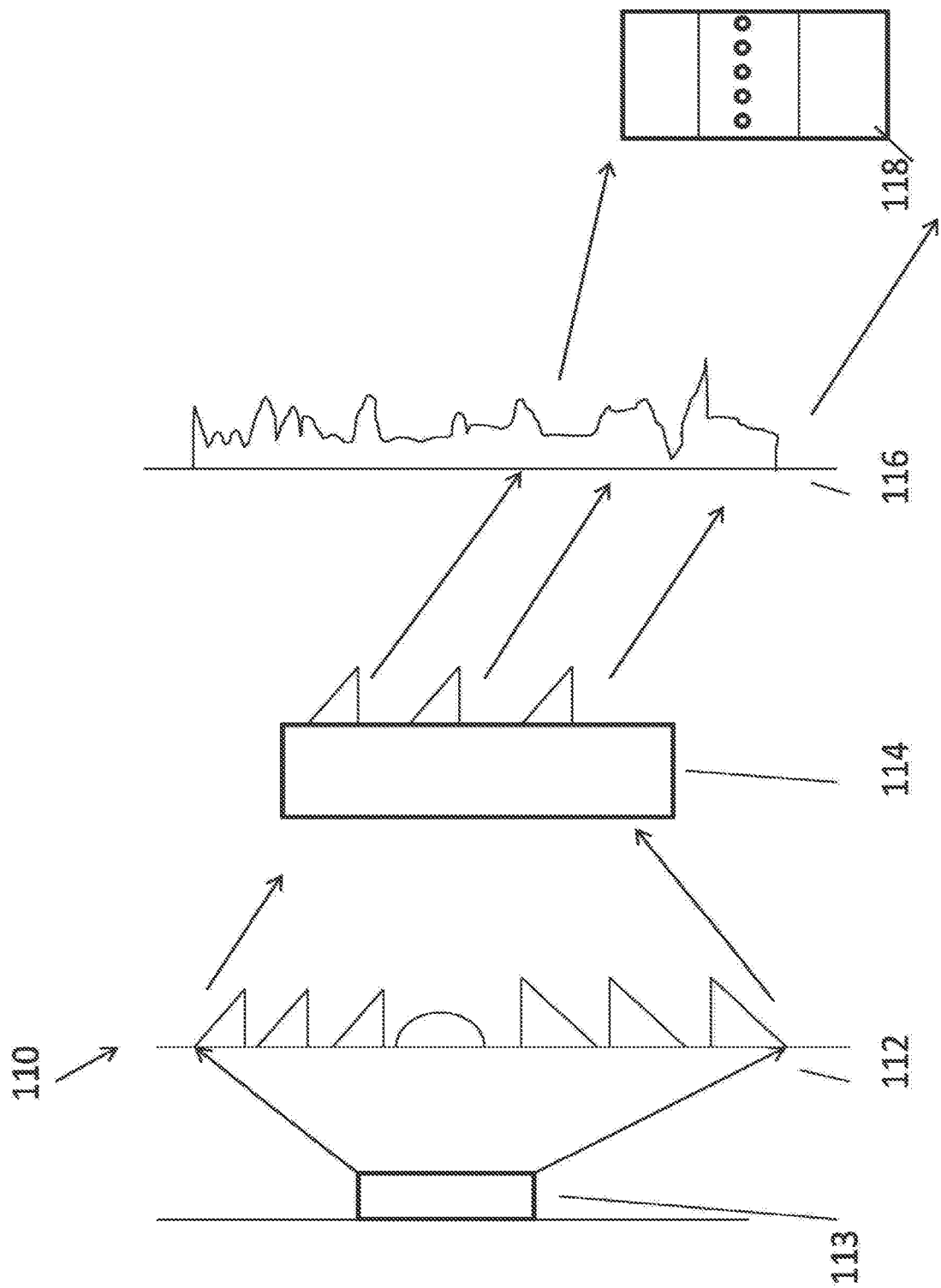
FIG. 11 is a simplified diagram showing a multistage optical element comprising focusing, beam directing and beam shaping, according to an embodiment of the present invention.

Reference is now made to FIG. 7, which is a simplified schematic diagram illustrating various operations, that is different optical functions of the optical element, available for modulating the laser light from a single or sub optical cell 70, or a number of cells such as 18 shown in FIG. 1, using laser array 72 to form the projected patterns. Any particular cell may allow the position of the beam to be modified, 76, or the phase of the beam may be modified 78, or the focus may be modified, 80, or the shape of the beam may be modified 82, or the intensity of the beam may be modified 84, or the polarization of the beam may be modified 86. The above is not an exhaustive list and other modifications will be apparent to those skilled in the art. Additionally the optical functions may be utilized by a single optical element or by multiple optical elements as shown in FIG. 11, wherein multiple functions such as focus, shape etc. are incorporated into the cell element.

Figure 8:
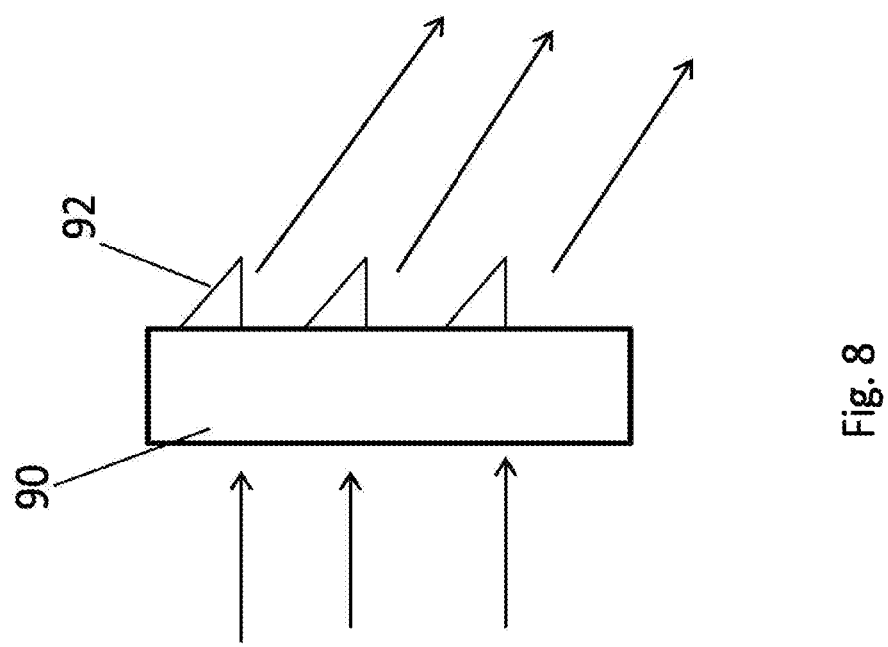
FIG. 8 is a schematic diagram illustrating placement or redirecting of a beam by an optical element in accordance with embodiments of the present invention.

Reference is now made to FIG. 8, which shows an optical element 90 changing a direction of a light beam. Features 92 emerging from the body of the device, because the change in direction of the light beam, and depending on the construction may be due to refraction, diffraction or a combination of refraction and diffraction. In the example illustrated, a saw tooth configuration in which tooth-like shapes have a downwardly sloping upper face and a horizontal lower face because downward bending of the light.

Figure 9:
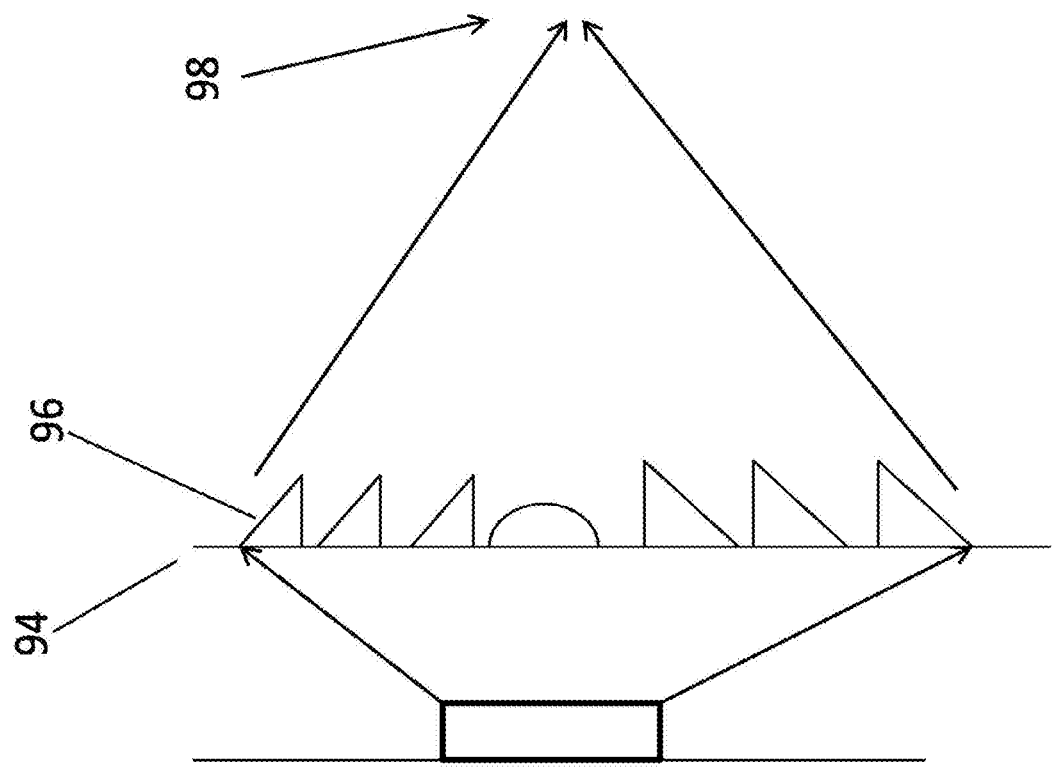
FIG. 9 is a simplified diagram illustrating the use of an optical element of the present invention for focusing of a beam.

Reference is now made to FIG. 9 which shows a construction 94 for focusing of the light beam. Features 96 are arranged in a saw tooth configuration as in FIG. 8, but the orientation of the tooth-like features is exchanged in the lower half of the construction, causing the upper and lower halves of the beam to meet at focal point 98.

Reference is now made to FIG. 10, which is a simplified diagram showing a variation 100 of the optical element for shaping of the beam. A preset random function is used to define a surface 102 of the optical element in order to shape the beam into a way that differentiates the beam from other beams.

Reference is now made to FIG. 11, which is a simplified diagram showing an optical element 110, which may relate to a cell or a sub cell, and which combines the optical elements of the previous three figures. A first part 112 focuses a beam produced by VCSEL array 113. Part 114 bends the beam, in this case in a downward direction, and part 116 shapes the beam.

Figure 12:
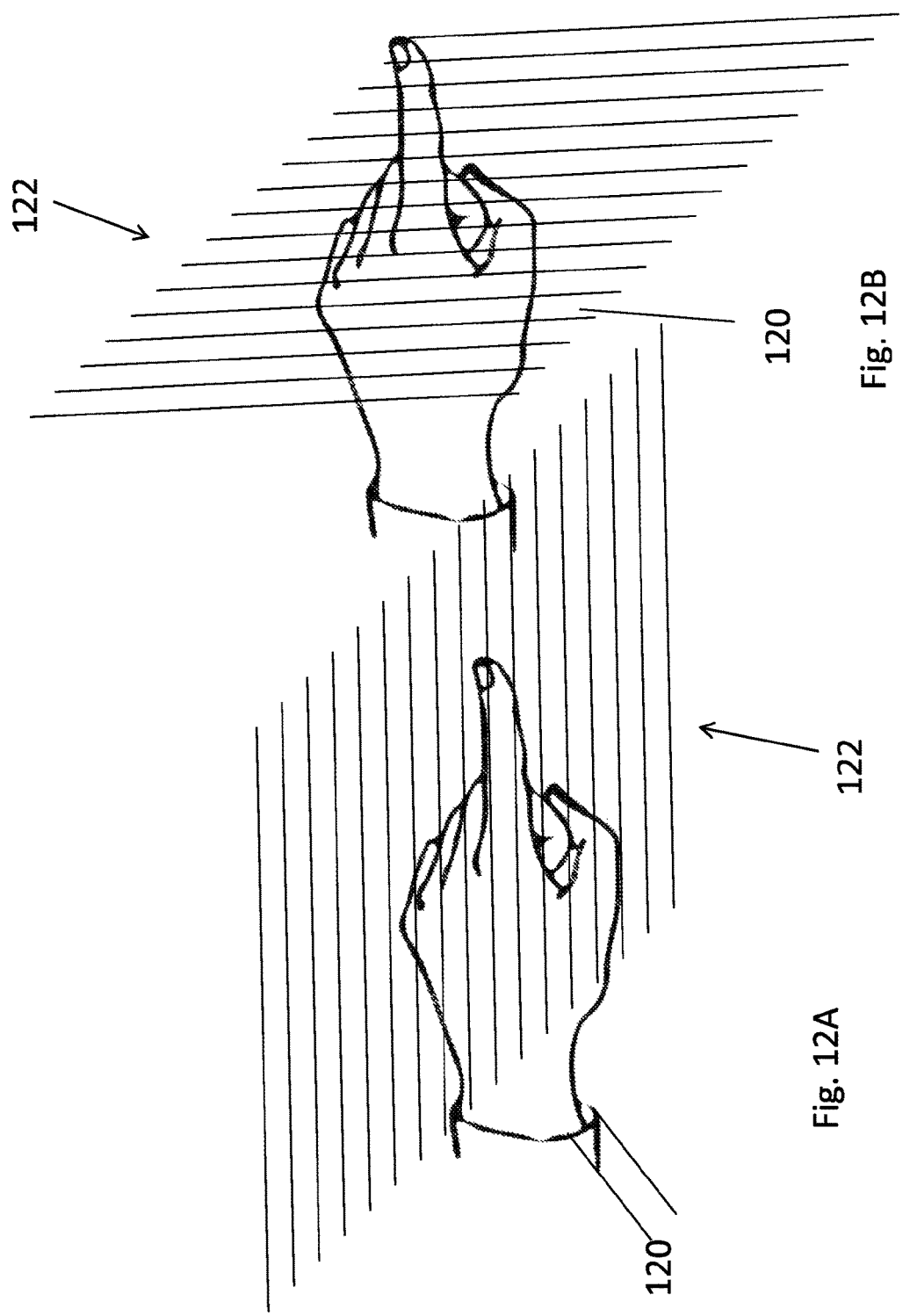
FIGS. 12a and 12b illustrate the effect of using stripes on a pointing finger and show how the stripes may need to be reoriented if they are parallel to the finger.

Reference is now made to FIG. 12A which shows a hand 120 being tracked by a pattern 122 of horizontal stripes. It is apparent that the pattern happens to coincide with the lengths of the fingers and thus information/data provided regarding the fingers is limited and it is difficult to identify the shape of the object. Nevertheless the fingers may often be the points of major interest as they provide the gestures that the system uses as commands. The system may therefore change, for example automatically the orientation of the stripes to that shown in FIG. 12B so that the stripes cross the fingers, hence providing more information. The change is done based on image analysis feedback as included in the flow chart.

FIGS. 13 to 17 illustrate various changes that may be made to the light pattern in order to improve tracking. FIG. 13 shows a change in the orientation of the stripes from horizontal to vertical as in the previous figure. FIG. 14 shows a narrowing of the field of view. Narrowing may be useful for example in a case where fingers are a feature of interest. Once the fingers are found then the field of view may be narrowed to concentrate on them.

Figure 16:
FIG. 16 illustrates dynamic changing of patterns between continuous lines and lines made up of dashes, according to embodiments of the present invention.
Figure 17:
FIG. 17 illustrates dynamic changing of patterns between lines of low intensity and lines of high intensity according to embodiments of the present invention.

FIG. 15 shows an increase in density of the stripes. FIG. 16 shows a change in shape from pure stripes to lines of dashes. FIG. 17 shows changes in intensity. Lines of low intensity in the first image are changed into lines of high intensity in the second image and vice versa. Suitable selection of the low and high density lines may be used to track an object in the depth dimension.

Figure 18:
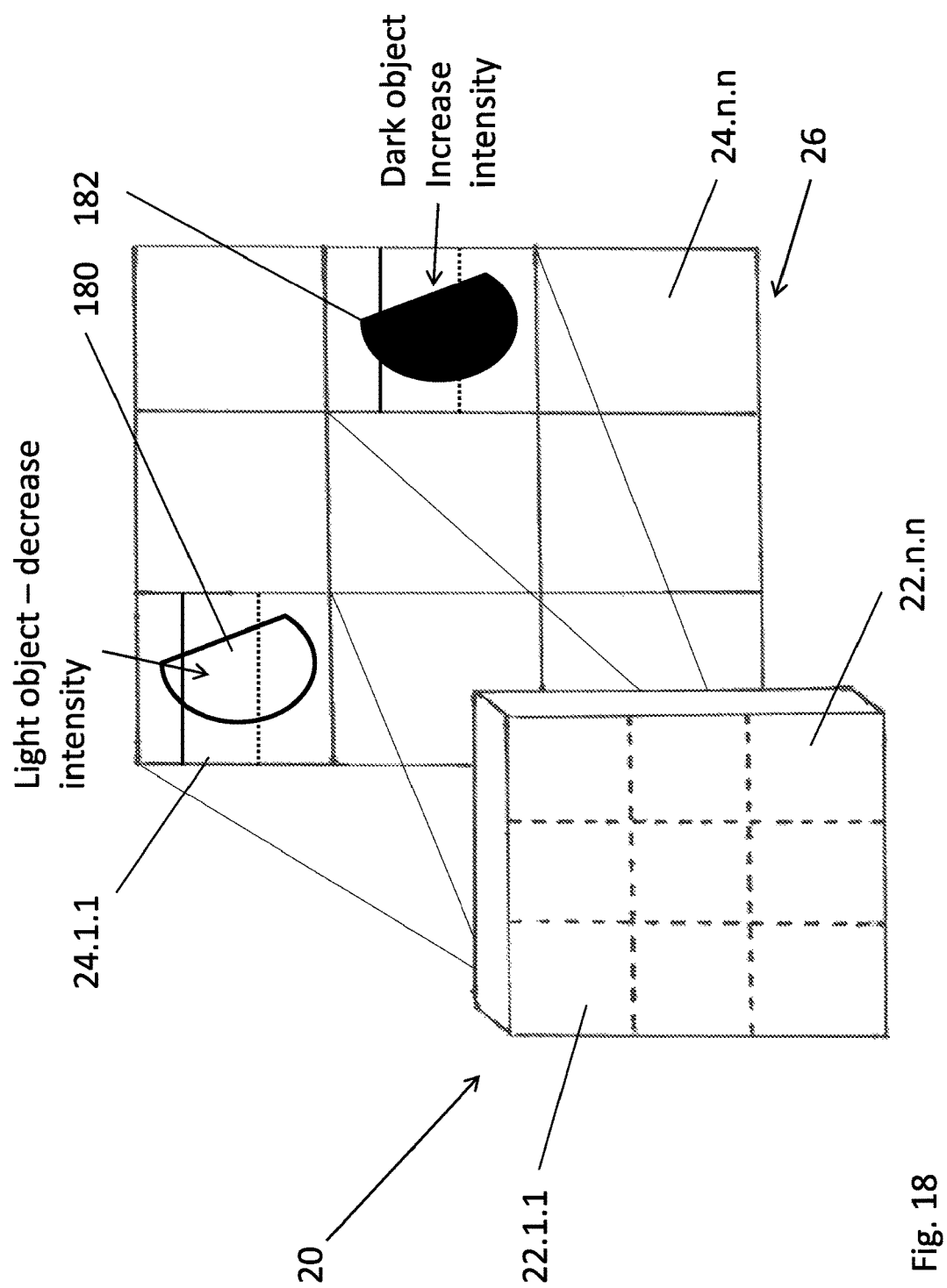
FIG. 18 illustrates changing of light intensity depending on the darkness or brightness of an object according to embodiments of the present invention.

Reference is now made to FIG. 18, which shows how light and dark objects may be tracked using the embodiment of FIG. 2. Parts that are the same as in FIG. 2 are given the same reference numerals and are not described again except as needed for an understanding of the present embodiment. In FIG. 18, a light colored object 180 is found in the cell area 24.11. The intensity of the stripes is decreased. A dark colored object 182, by contrast, is found in the area of cell 24.2.3. For the dark object the intensity is increased. The different cells are able to operate independently and each area reacts appropriately to the objects it is respectively tracking.

Figure 19:
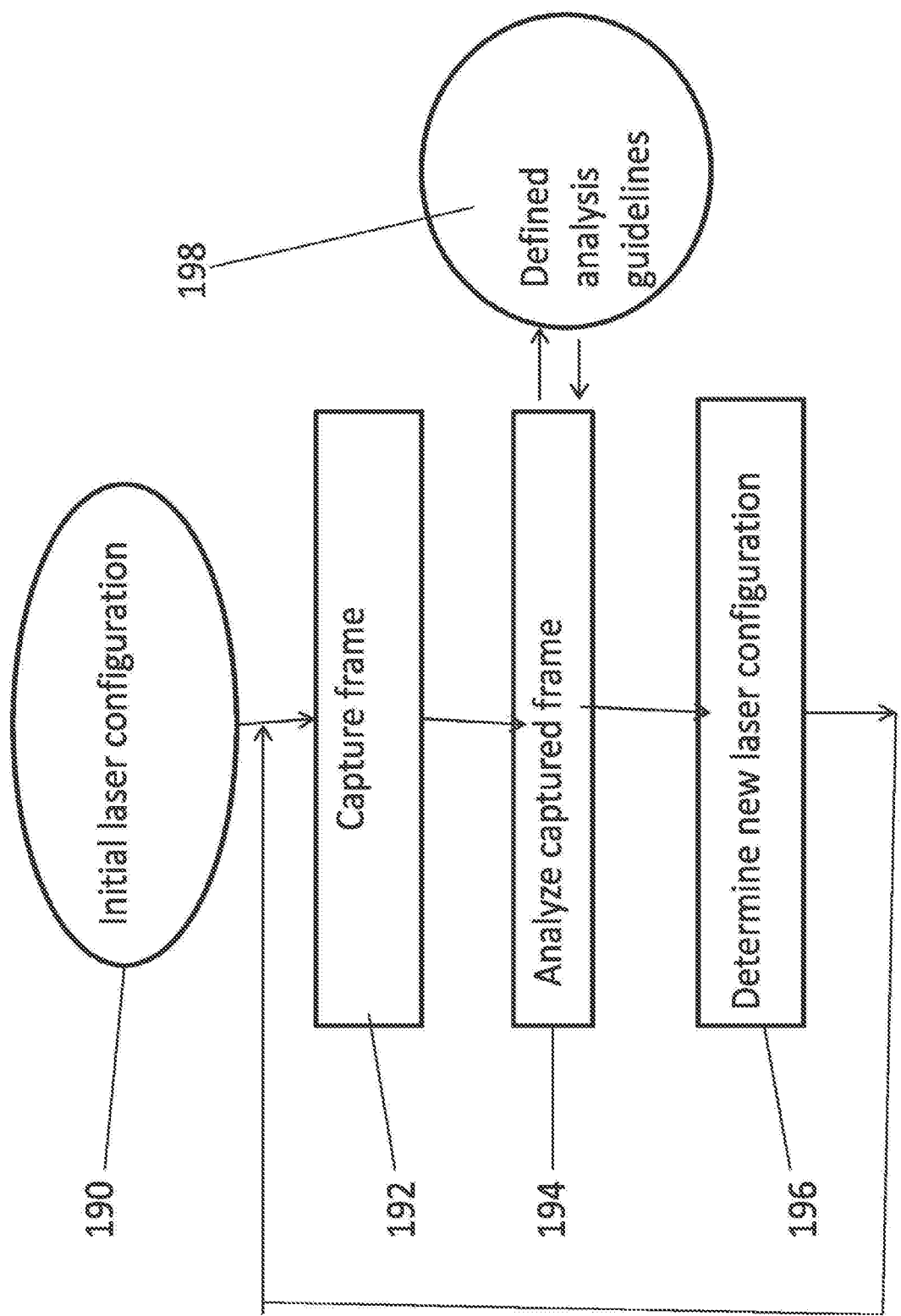
FIG. 19 is a simplified flow chart illustrating dynamic changing of patterns carried out following frame analysis according to embodiments of the present invention.

Reference is now made to FIG. 19, which is a simplified flow chart illustrating a procedure for modifying the pattern in a cell according to an embodiment of the present invention. A particular cell starts a cycle with an initial configuration—190. A frame is captured 192 and analyzed 194. From the analysis a new laser configuration is determined 196 based on defined analysis guidelines 198. That is to say for any particular situation there is a defined change in the pattern, which defined change may obtain more information about the object in the frame. The new laser configuration then serves as the initial laser configuration for the next frame.

The terms "comprises," "comprising", "includes", "including", "having" and their conjugates mean "including but not limited to".

The term "consisting of" means "including and limited to."

As used herein, the singular form "a," "an" and "the" include plural references unless the context clearly dictates otherwise.

It is appreciated that certain features of the invention, which are, for clarity, described in the context of separate embodiments, may also be provided in combination in a single embodiment, and the above description is to be construed as if this combination were explicitly written. Conversely, various features of the invention, which are, for brevity, described in the context of a single embodiment, may also be provided separately or in any suitable sub combination or as suitable in any other described embodiment of the invention, and the above description is to be construed as if these separate embodiments were explicitly written. Certain features described in the context of various embodiments are not to be considered essential features of those embodiments, unless the embodiment is inoperative without those elements.

Although the invention has been described in conjunction with specific embodiments thereof, it is evident that many alternatives, modifications, and variations will be apparent to those skilled in the art. Accordingly, it is intended to embrace all such alternatives, modifications, and variations that fall within the spirit and broad scope of the appended claims.

All publications, patents, and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. An apparatus comprising:
   an optical element that comprises a plurality of cells, each respective cell being aligned with a corresponding laser of an array of lasers such that the respective cell is individually controllable to apply a modulation to light previously emitted from the corresponding laser that later passes through the respective cell separate from the corresponding laser to form a part of a light pattern; and a processor that configures the respective cell to adjust the modulation of the light when the light previously emitted from the corresponding laser later passes through the respective cell to affect a change in the part of the light pattern.

2. The apparatus of claim 1, wherein the respective cell comprises a diffractive optical element.

3. The apparatus of claim 1, wherein each respective cell has a unique diffractive pattern.

4. The apparatus of claim 1, wherein the optical element and the array of lasers are constructed from a single molded element.

5. The apparatus of claim 1, wherein the processor is configured to affect a change in a position of the light pattern and a shape of the light pattern by controlling the respective cell.

6. The apparatus of claim 1, wherein a surface of the optical element is divided into the plurality of cells.

7. The apparatus of claim 1, wherein the light that passes through the respective cell forms a partial tile of the light pattern.

8. The apparatus of claim 1, wherein the modulation applies an increased resolution of the light pattern to parts of a scene, and the modulation applies a reduced resolution of the light pattern to other parts of the scene.

9. The apparatus of claim 1, wherein the modulation comprises a cellwise change to orientation of the light pattern.

10. The apparatus of claim 1, wherein the modulation is selected from a group consisting of: a diffractive modulation, a refractive modulation, and a combination of a diffractive and a refractive modulation.

11. The apparatus of claim 1, wherein the modulation is selected from a group consisting of: a change in intensity, a change in polarization, a change in filtering parameters, and a change in focus.

12. The apparatus of claim 1, wherein the array of lasers is selected from a group consisting of: individual lasers, pairs of lasers, triplets of lasers, combinations of different sizes of lasers, and dynamically changing combinations of lasers.

13. The apparatus of claim 1, wherein the array of lasers and the optical element are configured to project the light pattern into a three-dimensional space to track a three-dimension scene.

14. The apparatus of claim 1, wherein the array of lasers comprises a source selected from a group consisting of: a laser bar and a vertical cavity surface emitting laser (VCSEL) array.

15. A method comprising:
individually controlling a respective cell, of a plurality of cells in an optical element, that is aligned with a corresponding laser of an array of lasers to apply a modulation to light previously emitted from the corresponding laser that later passes through the respective cell separate from the corresponding laser to form a part of a light pattern; and
adjusting the modulation of the light when the light previously emitted from the corresponding laser later passes through the respective cell to affect a change in the part of the light pattern.

16. The method of claim 15, further comprising:
affecting a change in a position of the light pattern and a shape of the light pattern by controlling the respective cell.

17. The method of claim 15, further comprising:
dynamically changing the light pattern by changing the modulation of the emitted light.

18. The method of claim 17, wherein dynamically changing the light pattern comprises increasing a resolution level in a part of a scene and reducing a resolution level in a different part of the scene.

19. The method of claim 17, wherein dynamically changing the light pattern comprises changing a density of patterning within the light pattern.

20. An apparatus comprising:
an optical element that comprises a plurality of cells, each respective cell being aligned with a corresponding laser of an array of lasers such that the respective cell is individually controllable to apply a modulation to light previously emitted from the corresponding laser that later passes through the respective cell separate from the corresponding laser to form a part of a light pattern, the modulation representing a first modulation; and
a processor configured to:
determine a second modulation configuration based on analyzing at least one captured frame, the second modulation configuration describing a modulation that is different from the first modulation, and
configure the respective cell to adjust a modulation of other light when the other light previously emitted from the corresponding laser later passes through the respective cell to apply the second modulation configuration.

* * * * *